United States Patent [19]
Mitani et al.

[11] Patent Number: 5,514,235
[45] Date of Patent: May 7, 1996

[54] METHOD OF MAKING BONDED WAFERS

[75] Inventors: Kiyoshi Mitani; Masatake Katayama, both of Takasaki, Japan

[73] Assignee: Shin-Etsu Handotai Co., Ltd., Tokyo, Japan

[21] Appl. No.: 262,113

[22] Filed: Jun. 17, 1994

[30] Foreign Application Priority Data

Jun. 29, 1993 [JP] Japan .................................. 5-158253

[51] Int. Cl.$^6$ ....................... H01L 21/304; H01L 21/324
[52] U.S. Cl. ..................... 156/153; 148/DIG. 12; 148/DIG. 135; 156/281; 437/225; 437/921; 437/974
[58] Field of Search ..................... 156/153, 281, 156/154; 437/974, 61, 62, 225, 921; 148/DIG. 12, DIG. 135, DIG. 159, DIG. 3

[56] References Cited

U.S. PATENT DOCUMENTS

| 3,123,953 | 3/1964 | Merkl | 29/25.35 X |
| 4,671,846 | 6/1987 | Shimbo et al. | 156/153 |
| 5,266,824 | 11/1993 | Abe et al. | 437/974 X |

OTHER PUBLICATIONS

Lasky, J. B., "Wafer Bonding for Silicon–on–Insulator Technologies," Applied Physics Letters, 48(1), 6 Jan. 1986, pp. 78–80.

Furukawa, K., et al, "Lattice Configuration and Electrical Properties at the Interface of Direct Bonded Silicon," Extended Abstracts of the 18th (1986 International) Conference on Solid State Devices and Materials, Tokyo, 1986, pp. 533–536.

"Double–Cantilever Cleavage Mode of Crack Propagation", Peter Gillis et al., pp. 647–658, Mar. 1964, Journal of Applied Physics, vol., 35, No. 3.

"Bonding of Silicon Wafers for Silicon–on–Insulator", W. P. Maszara et al., J. Appl. Physics 64(10), Nov. 15, 1988, pp. 4943–4950.

Primary Examiner—Jeff H. Aftergut
Attorney, Agent, or Firm—Barnes & Thornburg

[57] ABSTRACT

A method is disclosed for obtaining bonded wafers of SOI type, where impurity redistribution in the bulk of the wafers is suppressed and the bonding strength between the wafers is substantially higher compared with that in the prior art. This is accomplished by forming a thermally grown oxide layer on the surface of the thinner one(bond wafer) of two monocrystalline silicon wafers having thicknesses different from each other by more than 50 μm; then superposing the thinner wafer onto the other thicker wafer(base wafer); and finally conducting at least two heat treatments of the wafers at temperatures selected in the range of under 900° C. for a period of time selected in the range of from 0.5 min. to 120 min.

5 Claims, 3 Drawing Sheets

BLADE INSERTION METHOD

METHOD OF MAKING BONDED WAFERS

BACKGROUND OF THE INVENTION

1. Field of the Invention

The present invention relates to a method of making bonded wafers of SOI type with a thermally grown oxide layer sandwiched therebetween (hereinafter merely referred to as bonded wafers and SOI is an abbreviation of Silicon-on-Insulator.).

2. Description of the Prior Art

A substrate for use in semiconductor device fabrication is required increasingly to have a higher degree of freedom in designing of a devise fabricated thereon. Therefore, this trend of requirement makes the substrate of so-called SOI type to draw more attention to itself, which is bonded wafers being structured such that a thermally grown oxide layer sandwiched between two silicon wafers and at least one of them is monocrystalline. The bonded wafer may be in use for making an electronic device such as a semiconductor device or, for example, micro machine in one of the other fields of application.

In general, a conventional method of the bonded wafer comprises the steps of at least one of two mirror-polished wafers being thermally oxidized and thereby forming a silicon oxide layer all over the surface, superposing the two wafers, one on the other and with the silicon oxide layer sandwiched therebetween, bonding the wafers firmly by applying heat treatment to the thus superposed wafers, and finally grinding and polishing the thermally oxidized wafer (hereinafter referred to as a bond wafer) to make it a thin layer with a mirror-like surface thereon.

The thus made bonded wafers often have chances to separate from each other due to poor bonding even in the thinning step of the bond wafer and somewhere in a following device fabrication process.

In order to increase the bonding strength of bonded wafers the above mentioned heat treatment is usually carried out at a high temperature selected in the range more than 1000° C. The heat treatment at a high temperature in the range does not have a problem in the case where the both wafers do not have a diffused layer therein since the redistribution of an impurity by thermal diffusion is not a matter for deep reflection.

As for wafers, for instance, in which lateral concentrated impurity (as dopant) layers are introduced or impurity diffused regions are patterned, the high temperature heat treatment for bonding the wafers invites the problem of redistribution of an impurity by thermal diffusion.

On the other hand, the advantages peculiar to the bonded wafers draws recent attentions in not a few fields of application of an electronics-related technology. Taking examples, the SOI type bonded wafers with an ultra-thin bond wafer has been obtained by means of so-called the etch stop method, wherein, for example, the characteristic relation in regard to KOH etching rate vs boron concentration for monocrystalline silicon is utilized to stop a KOH etching of the bond wafer at a high boron concentration in the vicinity of the bonding interface and thereby to leave the very thin bond wafer. Furthermore, fabrication of three dimensional integrated circuits is within the bounds of possibility.

In order to bring a reality to these applications, it is absolutely necessary that a relatively lower temperature range is adopted in the heat treatment so as not to induce an impurity redistribution and that to realize the bonding strength large enough.

A method to realize the necessities above mentioned is proposed, which is to apply an electrostatic force between wafers superposed.

According to the method, however, electrodes have to be mounted, therefore it lacks ability of mass production and what's more the applied electrical field has a chance to deteriorate the quality of the oxide layer interposed in the bonded wafers.

SUMMARY OF THE INVENTION

The present invention was made in view of the above problems, and it is, therefore, an object of the invention to provide a method of making bonded wafer and more particularly, to minimize redistribution of doped impurities in the bonded wafers (wherein at least one of the wafers has a region different in impurity concentration or in species from the rest of the bulk) and further to realize the large enough bonding strength of the bonded wafers for use in, for example, electronics device fabrication by application of heat treatments at temperatures in the range comparatively lower than those conventionally adopted to the bonded wafers.

It is another object to eliminate a harmful influence on a buried oxide layer as well as to secure a higher ability in mass production.

In order to achieve the objects, according to the present invention, two wafers which are of monocrystalline silicon and different from each other in thickness by more than 50 µm are prepared, then an oxide layer is formed all over the surface of the thinner wafer, next the thinner wafer is superposed on the thicker wafer with the oxide layer facing to the thicker wafer, and finally the thus superposed wafers receive at least two successive heat treatments at temperatures selected in the range of less than 900° C. for a period of time from 0.5~120 min. so as to bond the superposed wafers securely.

In the present invention, even two wafers at least, one of which has an impurity diffused region different in concentration or in species from the rest of the bulk may be bonded with minimizing redistribution of an impurity already diffused in.

Experiments conducted by the inventors have confirmed that in accordance with the present invention two wafers for bonding are different in thickness from each other by more than 50 µm, an oxide layer is formed covering all over the thinner wafer and besides more than two heat treatments are applied to the wafers, so that a bonding strength large enough for a variety of application is obtained.

A mechanism working inside the above phenomenon is still not elucidated enough for complete understanding, but the inventors have an idea to be developed into the mechanism.

According to the idea, during a heat treatment in a bonding step there is given a slight differential in temperature between the surfaces facing to each other, whereby the spherical concavity of the thicker wafer surface wafer, so that the surfaces facing to each other are easy to contact closer to each other, which entails the stronger bonding.

As clearly understood from the above description, according to the present invention, undesirable thermal redistribution of an impurity is minimized and that with resulting in stronger enough bonding between two wafers and accordingly, the bonded wafer of SOI type with a ultra thin bond wafer becomes a reality by the effective use of so-called the Etch stop method above described without a loss of sharpness in boundary of a concentrated boron doped layer with the adjacent undoped bulk in a wafer and further a three dimensional integrated circuit will be in a practical use in the future because of less of impurity redistribution of a diffused layer or in a locally diffused pattern.

What's more, in the present invention, superposed wafers are not treated under an electrical field applied and therefore, there is no need for mounting electrodes on the wafers, so that a higher ability in the mass production is secured and at the same time a bad influence on a buried oxide layer entailed by application of an electrical field is eliminated.

DETAILED DESCRIPTION OF THE PREFERRED EMBODIMENT

Below illustrated is an embodiment according to the present invention, referring to the accompanying drawings. FIG. 1 (a)–(c) are a diagram illustrating a method of the present invention in the order of application of the steps and FIG. 2 is a graph showing a relation between temperatures and time of heat treatments for bonding wafers.

Figure 1A:
FIG. 1 (a)–(c) are a diagram illustrating a method of the present invention in the order of application of the steps.
Figure 1A:
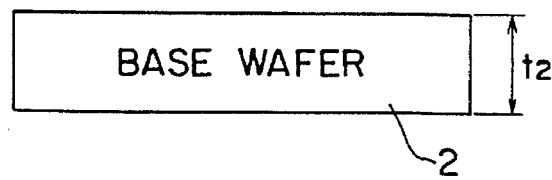
Figure 1B:
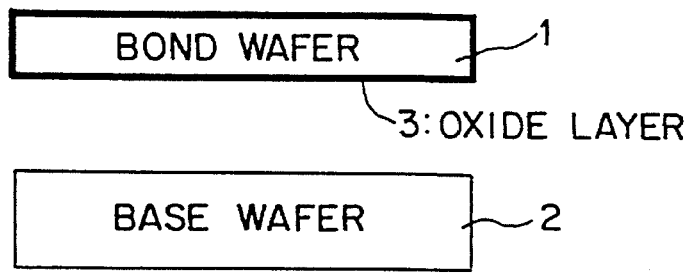
Figure 1C:
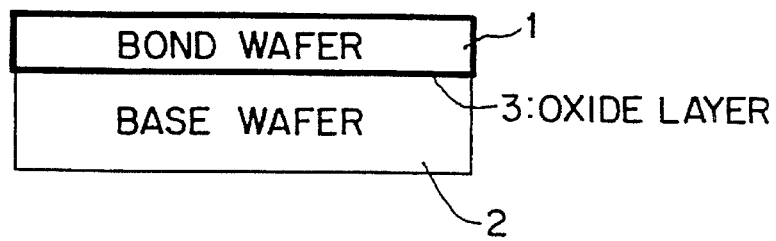
Figure 2:
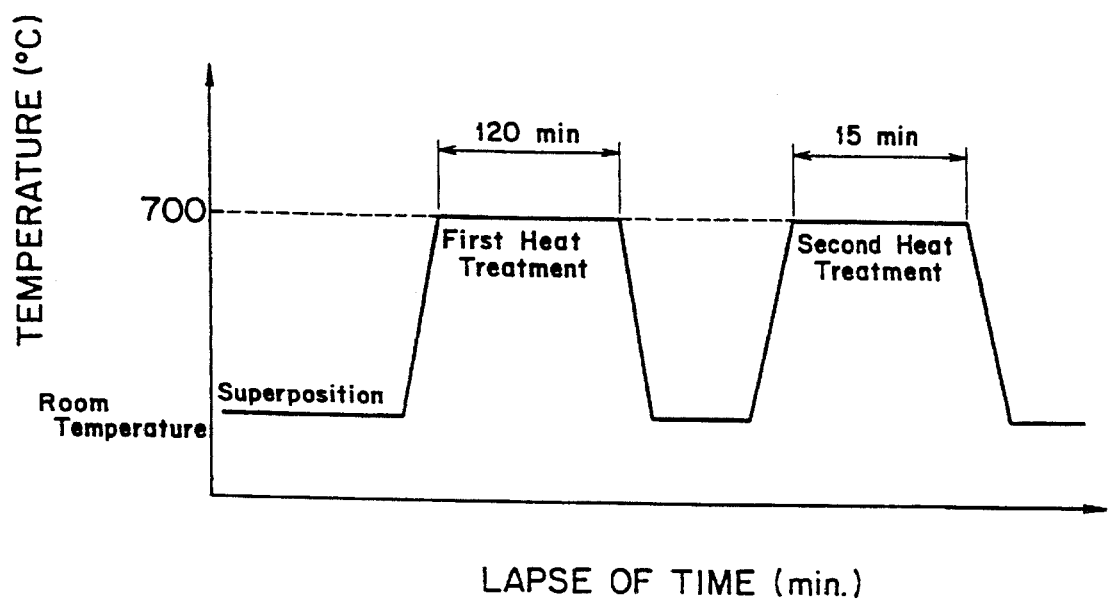
FIG. 2 is a graph showing a relation between temperatures and time of heat treatment for bonding wafers.

Referring to FIG. 1 and FIG. 2 of the drawings, a method of making bonded wafers according to the present invention is illustrated as follows: as shown in FIG. 1 (a), first of all, a bond wafer 1 of $t_1$ in thickness, which to be used for fabrication of a variety of components and a base wafer 2 of $t_2$ in thickness, which to be used for the support are prepared, where the respective thicknesses of $t_1$ and $t_2$ of the wafers 1 and 2 are set so as to be different from each other by more than 50 μm and the thickness $t_2$ of the base wafer 2 is larger than the thickness $t_1$ of the bond wafer 1 by 50 μm ($t_2-t_1 \geq 50$ μm).

Then, the bond wafer 1, which is thinner than the base wafer 2, is heat-treated in a wet oxygen atmosphere for the purpose of thermal oxidation and, as a result, as shown in FIG. 1 (b), an oxide layer 3 (SiO$_2$ oxide layer) about 1 μm thick is grown on the entire surface. thick is grown on the entire surface.

Thereafter, as shown in FIG. 1 (c), the bond wafer 1 is superposed to adhere to the base wafer 2 with the oxide layer 3 sandwiched therebetween at the room temperature.

Next, the adhered two wafers 1, 2 are brought into a heat treatment furnace (not shown) and without intermission, receive two heat treatments at 700° C., which is chosen in the range of under 900° C. In more particular, the two wafers 1, 2 adhered to each other at the room temperature, are brought into a heat treatment furnace, heated up to 700° C. for 120 min. and kept at the temperature, and received a first heat treatment at the temperature and left to cool down near the room temperature. A second heat treatment is applied to the wafers already heat-treated in the first heat treatment, where the same conditions except for the duration of heat treatment are adopted. The period of time is for 15 min. in this case.

According to the present invention, every heat treatment (in the embodiment shown in FIG. 2, means the first and the second heat treatments) is carried out in a rather low temperature under 900° C. and consequently, which results redistribution, even in the case where at least one of the two wafer 1, 2 has a region therein different in species or in concentration from the rest of the wafer bulk.

Figure 3:
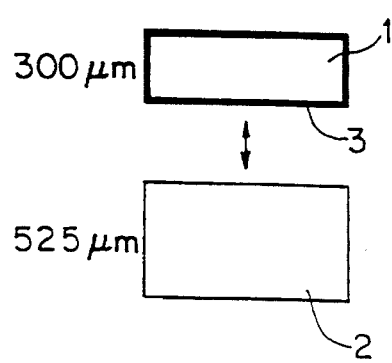
FIG. 3 is a diagram showing samples of pairs of bonded wafers for use in experiments on bonding strength.
Figure 3:
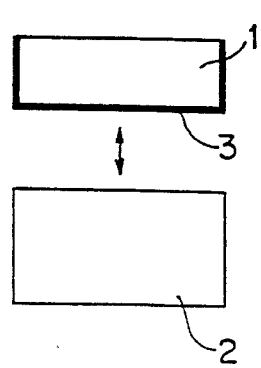
Figure 3:
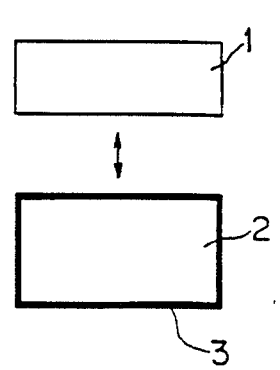
Figure 4:
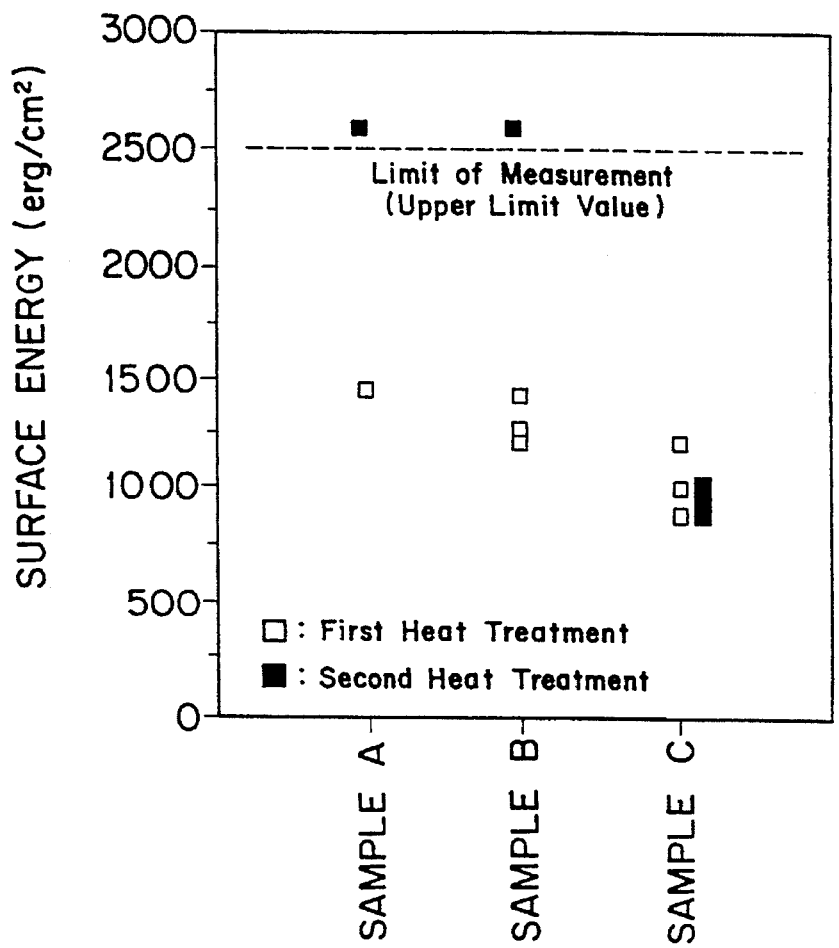
FIG. 4 is a diagram showing the measured bonding strengths of the samples of pairs of bonded wafers.

Next, experiments on the bonding strength of bonded wafers are illustrated, referring to FIG. 3 and FIG. 4.

In the experiments, three samples are prepared and designated A, B and C respectively. Any of the samples A, B and C each consists of a bond wafer of 100 mm in diameter, (100) plane and 300 μm in thickness and a base wafer of 100 mm in diameter, (100) plane and 525 μm in thickness (The thickness differential between the wafers 1 and 2 is $t_2-t_1=$ 225 μm in this case.).

All the samples A, B and C are received a heat treatment for thermal oxidation in a wet oxygen atmosphere and provided with a oxide layer 3 of 1 μm thick each, on the entire surface of bond wafer 1 as for the sample A; on the entire surface except the surface of one side of the bond wafer 1 as for the sample B; and on the entire surface of the base wafer 2 as for the sample C.

The bond wafers 1 of the samples A, B and C are respectively superposed on the base wafers 3 with the oxide layers 3 sandwiched therebetween at the room temperature and each pair of superposed wafers 1 and 2 is treated with a first heat treatment (the temperature of 700° C. and the period of time of 120 min.) as shown in FIG. 2.

The samples A, B and C are taken a measurement of bonding strength by means of a method that was developed by W. P. Maszara et al. in J. Appl. phys. 64, 4943(1988) (hereinafter referred to as Blade Insertion method).

Figure 5:
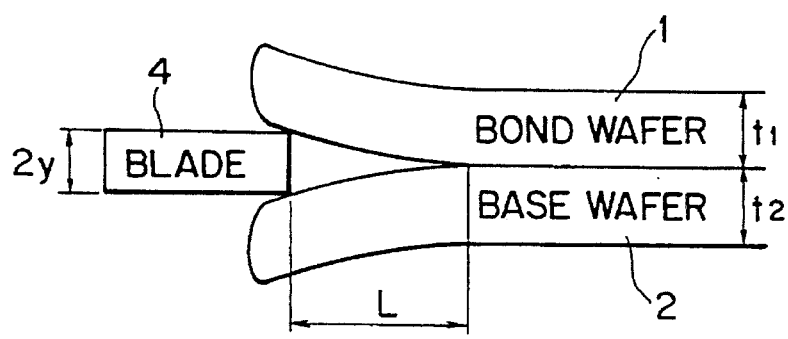
FIG. 5 schematically illustrates the principle of measurement of a bonding strength by BLADE INSERTION METHOD.

The Blade Insertion method is illustrated in the schematic diagram showing the principle of the Blade Insertion method in FIG. 5. The method was derived from the theoretical analysis of crack propagation in a cleaved bulk sample of a linearly elastic solid developed by P. P. Gillis and J. J. Gillman appeared in J. Appl. Phys. 35, 647(1964). Further, The following relationship between the surface energy and the geometry of a crack is utilized in the method.

$$\gamma = 3y^2 E t_1^3 t_2^3 / 4L^4 (t_1^3 + t_2^3)$$

Where $\gamma$ is the specific surface energy in erg/cm$^2$, 2y is the thickness of the blade (or crack separation). L is the length of the crack, $t_1$ and $t_2$ are the thicknesses of the bond wafer 1 and the base wafer 2 respectively as shown in FIG. 5. E is the modulus of elasticity, for Si(100), E= 1.66× 10$^{12}$ dyn/cm$^2$.

In the diagram in FIG. 4, the y coordinate of the rectangular coordinate system represents the specific surface energy in erg/cm$^2$, which is proportional to the bonding strength.

As is clearly confirmed from the results shown in FIG. 4, any of the samples A, B and C, after a first heat treatment, shows the bonding strengths on the roughly same level, where the data are plotted with white squares □.

After a second heat treatment was applied, the second measurements of the bonding strengths of the samples A, B and C were carried out. The data of the second measurements are marked with black squares ■ in FIG. 4. As far as the samples A and B are concerned, they show too high bonding strengths in value to be measured by the Blade Insertion method, whereas the sample C shows no increase in bonding strength by the second heat treatment.

A study was carried to find out a reason why the sample C showed no increase in bonding strength after the second heat treatment. the sample C was inspected with an infrared viewer which is sensitive to infrared radiation in the 0.8 to 1.2 μm region and the inventors found many voids at the bonding interface probably originated from poor bonding.

On the other hand, according to separate experiments for comparison, a plurality of pairs of bonded wafers, each pair of which are same in thickness, were received a plurality of heat treatments, but an increase in the bonding strength was confirmed to be negative of any pair of the bonded wafers in every heat treatment.

The experiments for comparison above were conducted in the same conditions as those for the embodiment according to the invention except to set thicknesses of a bond wafer 1 and a base wafer to be the same value of 525 μm. The samples A', B', and C' in the experiments for comparison showed the specific surface energy γ of 500~1000 erg/cm$^2$ in the first heat treatment and even in the second heat treatment, showed as low as 1500 erg/cm$^2$.

In the general, by nature, the measured values of a bonding strength fluctuates much in successive measurements of the same sample, however strictly preparation of sample wafers and conditions for experiments on bonding the wafers are standardized in appearance and besides the bonding strength is modified by the crystallographic specifications, the dimensions and the shape of the wafers, so that the reproducibility in measurement is poor.

Even under the above circumstances, the inventors have confirmed through the experiences gained after a number of experiments of the kind that it is absolutely desirable and effective for a bond wafer and a base wafer to be different by at least 50 μm in thickness therebetween.

According to the present invention, two wafers 1 and 2, which to be bonded, are different in the respective thicknesses of $t_1$ and $t_2$ by more than 50 μm, the thinner wafer, which is a bond wafer, is provided with an oxide layer 3 on the entire surface, in succession the pair of the wafers are superposed to adhere to each other, and finally treated by more than two heat treatments, so that the bonding strength of the bonded wafers 1 and 2 shows a high value enough for application to the field of an electronics devise or something special in the advanced state of one of other technologies.

What is claimed is:

1. A method of making bonded wafers with a large bonding strength which method comprises:

selecting two mirror-polished silicon wafers which differ in thickness from each other by more than 50 μm;

providing a thinner one of said two silicon wafers with a thermally grown oxide layer on its mirror-polished surface;

superposing said two silicon wafers on each other so that said thermally grown oxide layer on said thinner silicon is sandwiched between said superposed silicon wafers; and subjecting said superposed silicon wafers to a plurality of heat treatments which are separated by cooling treatments in which said superposed silicon wafers are cooled down to room temperature between heat treatments.

2. A method as in claim 1 wherein said heat treatments are carried out at temperatures selected in the range of from about 700° C. up to 900° C.

3. A method as in claim 2 wherein each of said heat treatments is carried out for 0.5 min. to 120 min.

4. A method as in claim 2 wherein said heat treatments are carrier out in a dry oxygen atmosphere.

5. A method as in claim 3 wherein said heat treatments are carried out in a dry oxygen atmosphere.

\* \* \* \* \*